(12) United States Patent
Tan et al.

(10) Patent No.: US 9,401,317 B2
(45) Date of Patent: Jul. 26, 2016

(54) HEAT SINK MOUNT AND ASSEMBLY

(75) Inventors: Rui Sheng Tan, GuangDong (CN); Xiong Zhang, Linxiang (CN); Zhe Hong Liu, Foshang (CN); San Xi Zheng, Guangdong (CN)

(73) Assignee: Aavid Thermalloy, LLC, Laconia, NH (US)

( * ) Notice: Subject to any disclaimer, the term of this patent is extended or adjusted under 35 U.S.C. 154(b) by 1156 days.

(21) Appl. No.: 13/014,506

(22) Filed: Jan. 26, 2011

(65) Prior Publication Data

US 2012/0186779 A1    Jul. 26, 2012

(51) Int. Cl.
*F28F 9/00*      (2006.01)
*H01L 23/40*   (2006.01)
*F28D 21/00*   (2006.01)

(52) U.S. Cl.
CPC .... *H01L 23/4093* (2013.01); *F28D 2021/0029* (2013.01); *F28F 2280/06* (2013.01); *H01L 2924/0002* (2013.01)

(58) Field of Classification Search
CPC .......... H01L 23/4093; F28F 2009/004; F28F 2280/06; F28F 9/002; F28D 2021/0028; F28D 2021/0029
USPC .................. 165/67, 80.3; 361/707, 709, 715
See application file for complete search history.

(56) References Cited

U.S. PATENT DOCUMENTS

| | | | |
|---|---|---|---|
| 5,371,652 A | 12/1994 | Clemens et al. | |
| 5,917,700 A | 6/1999 | Clemens et al. | |
| 6,153,932 A * | 11/2000 | Liang | 257/712 |
| 6,308,771 B1 | 10/2001 | Tavassoli | |
| 6,466,443 B1 | 10/2002 | Chen | |
| 6,476,484 B1 | 11/2002 | Liang | |
| 6,644,396 B2 | 11/2003 | Liang | |
| 6,788,538 B1 * | 9/2004 | Gibbs et al. | 361/704 |
| 6,980,437 B2 * | 12/2005 | Bright | H05K 7/20418 165/185 |
| 7,307,842 B1 | 12/2007 | Liang | |
| 7,567,435 B2 | 7/2009 | Azar et al. | |
| 2008/0000618 A1 † | 1/2008 | Liang | |
| 2010/0018670 A1 | 1/2010 | Azar et al. | |
| 2010/0044015 A1 | 2/2010 | Capriz et al. | |
| 2010/0157539 A1 * | 6/2010 | Wang et al. | 361/709 |

* cited by examiner
† cited by third party

*Primary Examiner* — Marc Norman
*Assistant Examiner* — Jon T Schermerhorn
(74) *Attorney, Agent, or Firm* — Wolf, Greenfield & Sacks, P.C.

(57) ABSTRACT

An assembly for a heat sink having a contact plate with opposing first and second faces, a plurality of fins extending from the first face of the contact plate, and a plurality of gaps between the fins. A retaining device has a first pair of opposing sides and a second pair of opposing sides, the first and second pairs of opposing sides surrounding an opening, the first pair of opposing sides having primary framing members, at least some of the primary framing members having a first end at a respective side and a distal free end, with at least one engagement member positioned proximate the distal free ends. The primary framing members define a receiving space for the heat sink. A metal spring is configured in a closed shape cross-section for engagement with the retaining device. The metal spring has a pair of elongated sides, a pair of truncated sides and heat sink engagement regions. The heat sink engagement regions are positioned against the contact plate when the metal spring is engaged with the retaining device, to urge the contact plate towards the engagement members. The assembly is particularly well suited for use with ball grid array packages to interface electronic components in such packages with the heat sink.

19 Claims, 12 Drawing Sheets

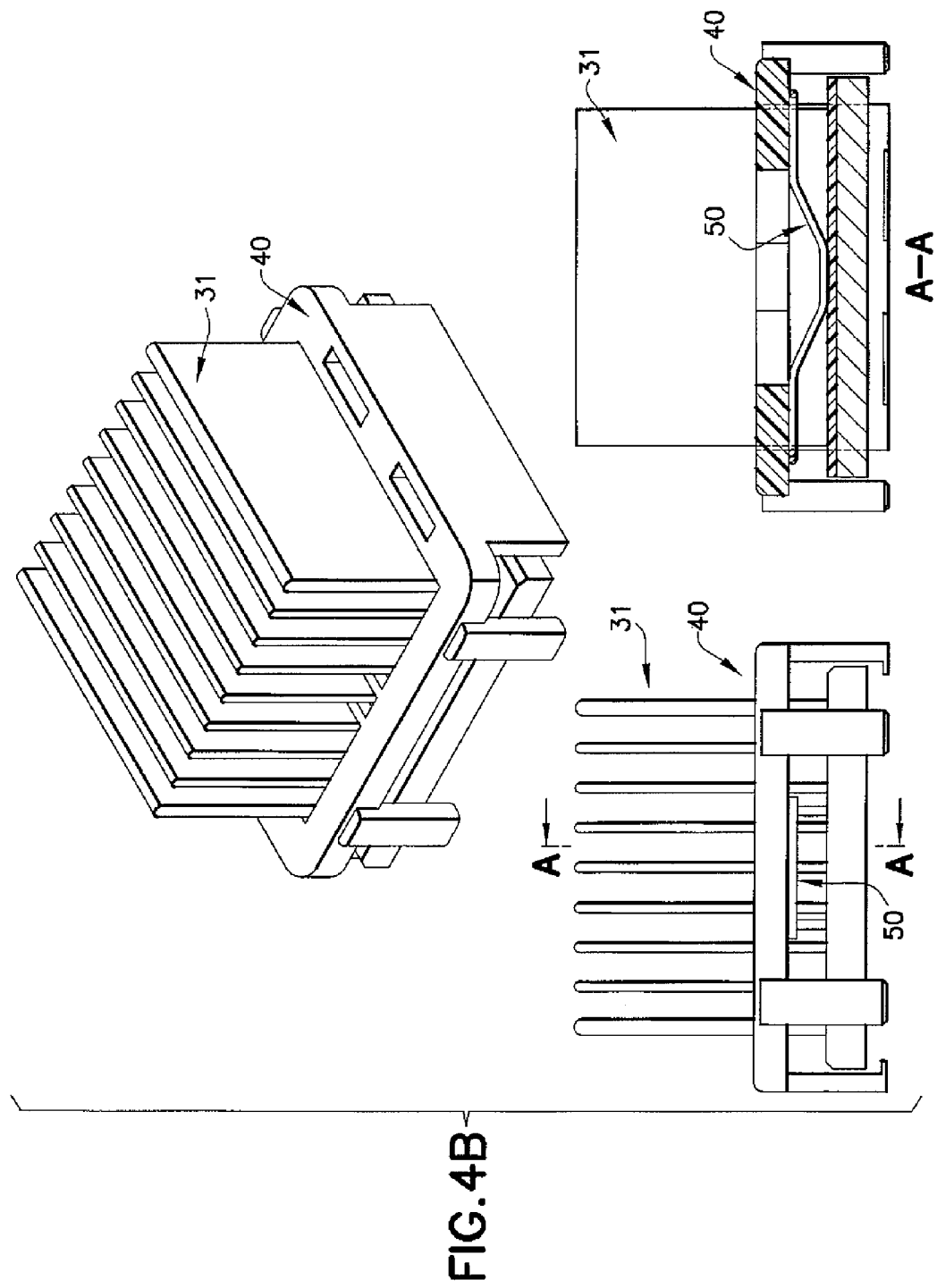

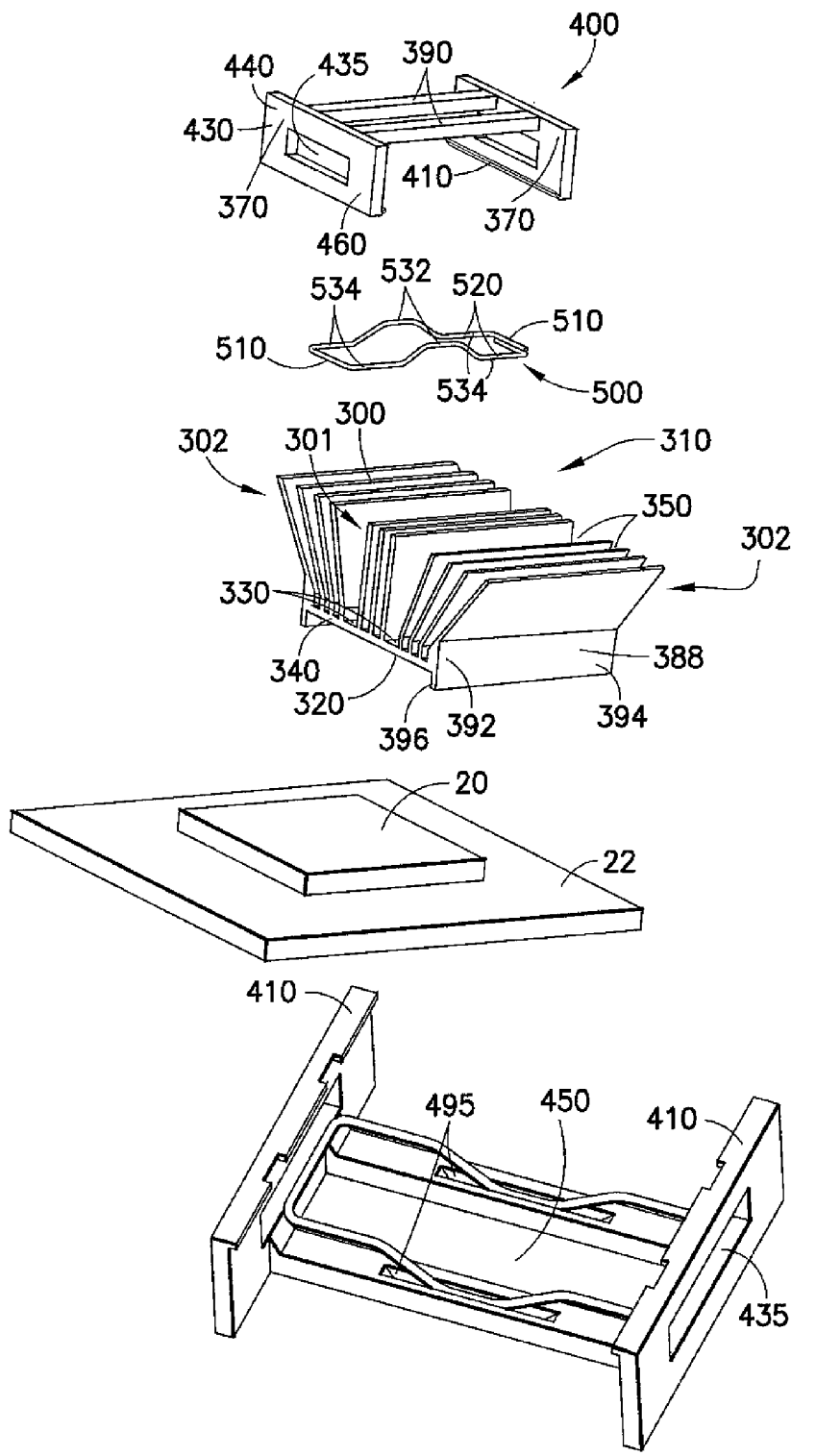

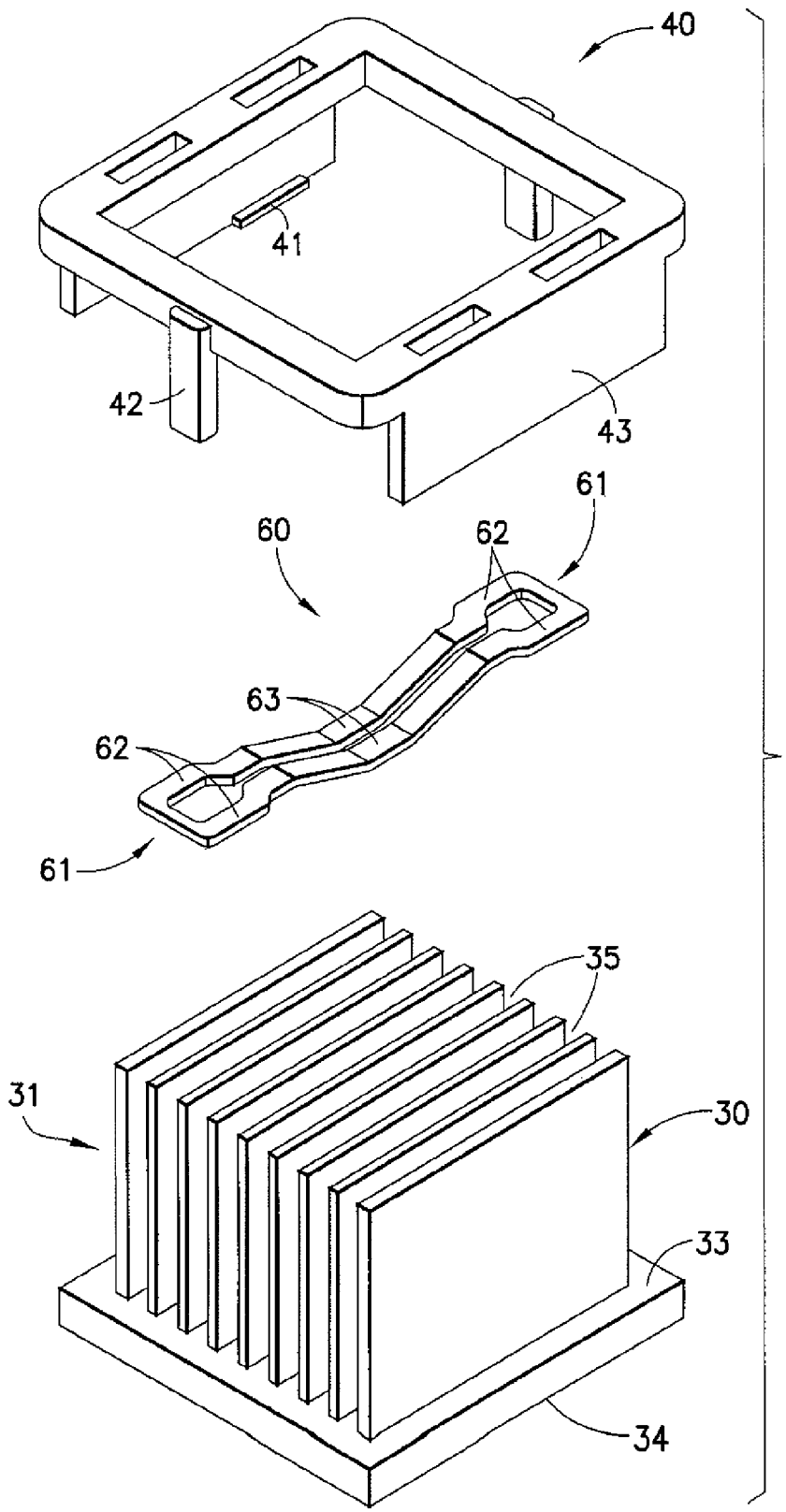

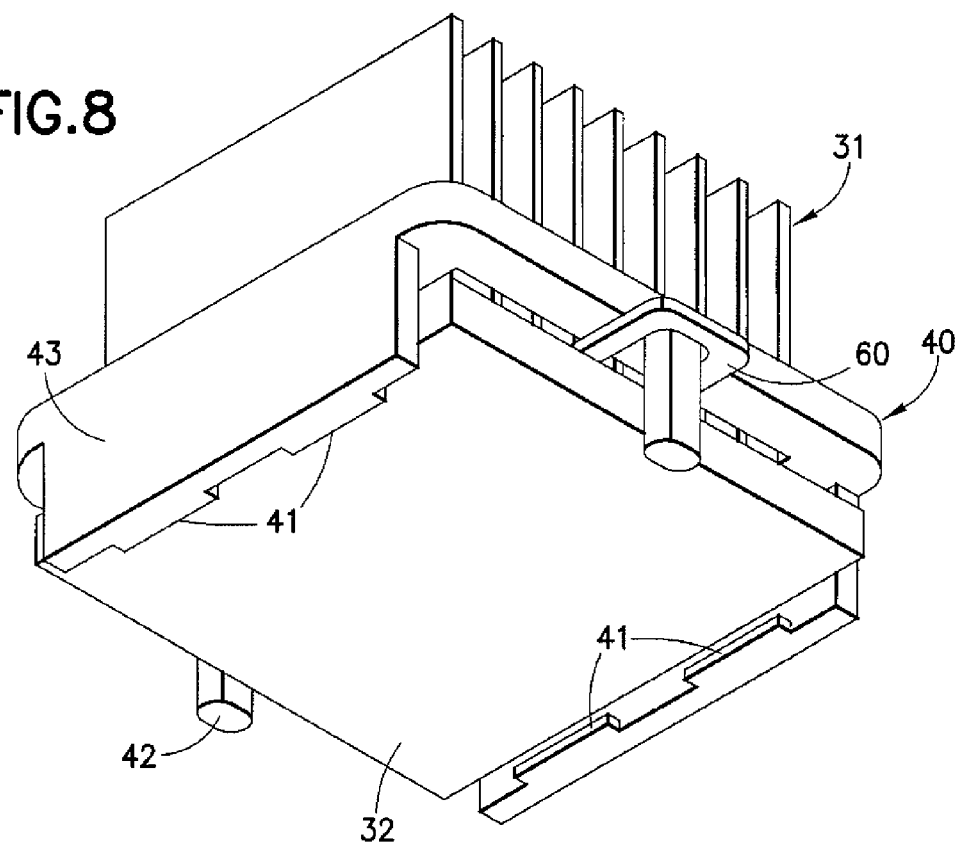
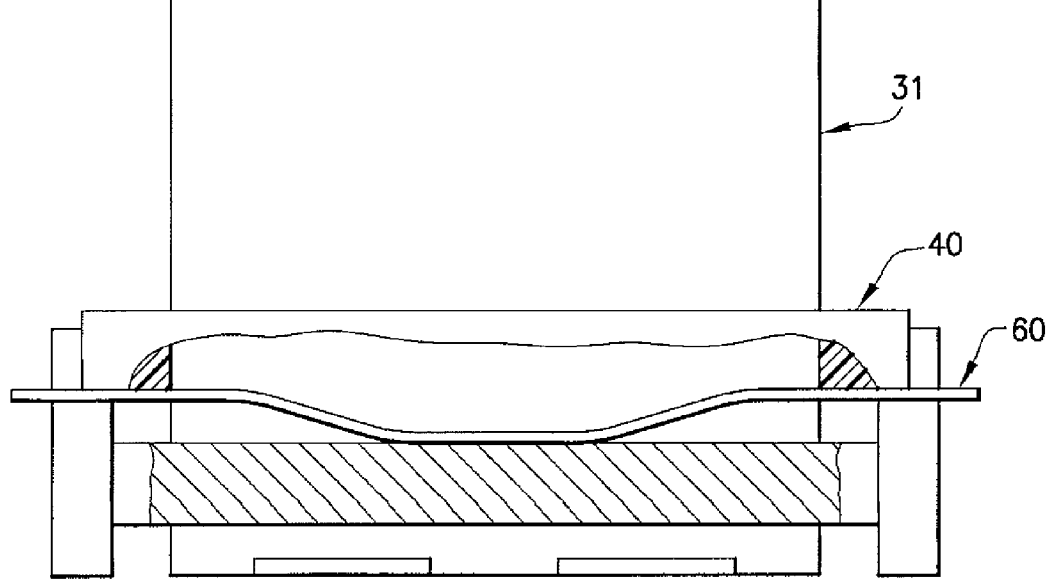

HEAT SINK MOUNT AND ASSEMBLY

FIELD OF THE INVENTION

The present invention relates to a heat sink mount and in particular to a heat sink assembly that utilizes a spring element and retaining device for mounting a heat sink to a heat generating device.

DESCRIPTION OF THE RELATED ART

Conventional heat sink assemblies and mounts use a plastic spring element that is integrally formed with a plastic frame to create a contact force between a heat sink and a heat generating device. In particular, the plastic frame comprises a first opposing pair of sides and a second opposing pair of sides which surround an opening for receiving fins of the heat sink. The plastic spring applies a force to the heat sink to urge the heat sink in thermal contact with a heat generating device, such as an integrated chip (IC).

A drawback of such existing heat sink assemblies is that the plastic spring element and the plastic frame experience plastic creep deformation caused by the force applied by the spring to the heat sink and by the heat transfer between the heat sink and heat generating device. Accordingly, failure of the conventional heat sink assemblies and mounts occurs because of the plastic creep deformation of the plastic spring element and the plastic frame.

SUMMARY OF THE INVENTION

According to an example embodiment, a heat sink mount has a retaining device and a metal spring. The retaining device has a first pair of opposing sides and a second pair of opposing sides that surround an opening. The first pair of opposing sides has primary framing members, such as walls, with each wall having a first end at a respective side and a distal free end. At least one engagement surface is positioned on each wall proximate the distal free ends. The walls at least partially define a receiving space for a heat sink having fins and a contact plate. The metal spring is configured in a closed shape cross-section and for interfacing with the retaining device. The metal spring has a pair of elongated sides, a pair of truncated sides and heat sink engagement regions. The heat sink engagement regions are positioned against the contact plate when the metal spring is interfaced with the retaining device for urging the contact plate towards the engagement surfaces when the heat sink is contained in the receiving space.

The heat sink mount and assembly is particularly suited for use with a ball grid array package. As used herein, "ball grid array package", refers to a mounting configuration for an integrated circuit (IC), chip or microprocessor wherein the IC, chip or microprocessor is connected to a substrate having an array of solder balls on a reverse side of the substrate. The ball grid array package is joined to a printed circuit board (PCB) via the array of solder balls which, during solder re-flow or other soldering process, are melted to form both electrical interconnect of the BGA package to the PCB and to mechanically fix the BGA package to the PCB. After the solder reflow or other soldering process, a finite spacing or gap remains between the BGA package and the PCB. The actual dimension of this spacing or gap depends on, among other things, the initial diameter of the solder balls and the process control parameters of the solder re-flow or other soldering process used. Typical final spacing (after solder process) is less than 1 mm, sometimes on the order of about 0.25 to 0.50 mm.

When the heat sink mount is used in connection with a BGA package mounted to a PCB, the heat sink mount is pressed over the BGA package such that the engagement members seat in the finite space or gap between the BGA package and the PCB. Once the heat sink mount is released, the metal spring will apply a compression force against the contact plate of the heat sink to force the heat sink in good thermal contact with the IC of the BGA package.

BRIEF DESCRIPTION OF THE DRAWINGS

The invention will now be described in further detail with reference to the drawings in which:

FIG. 4B is a perspective view and side views of the alternative spring location of FIG. 4A.

FIG. 4C is an alternative retaining device and spring configuration to the retaining device and spring configuration of FIG. 4;

FIG. 7 is an exploded perspective view of another example embodiment of a heat sink mount and assembly in accordance with the present invention;

FIG. 8 is a perspective view of the heat sink mount of FIG. 7 in a preferred operating configuration;

FIG. 9 is a schematic side view of the heat sink mount of FIG. 7 in a preferred operating configuration;

DETAILED DESCRIPTION OF THE PRESENTLY PREFERRED EMBODIMENTS

Figure 1:
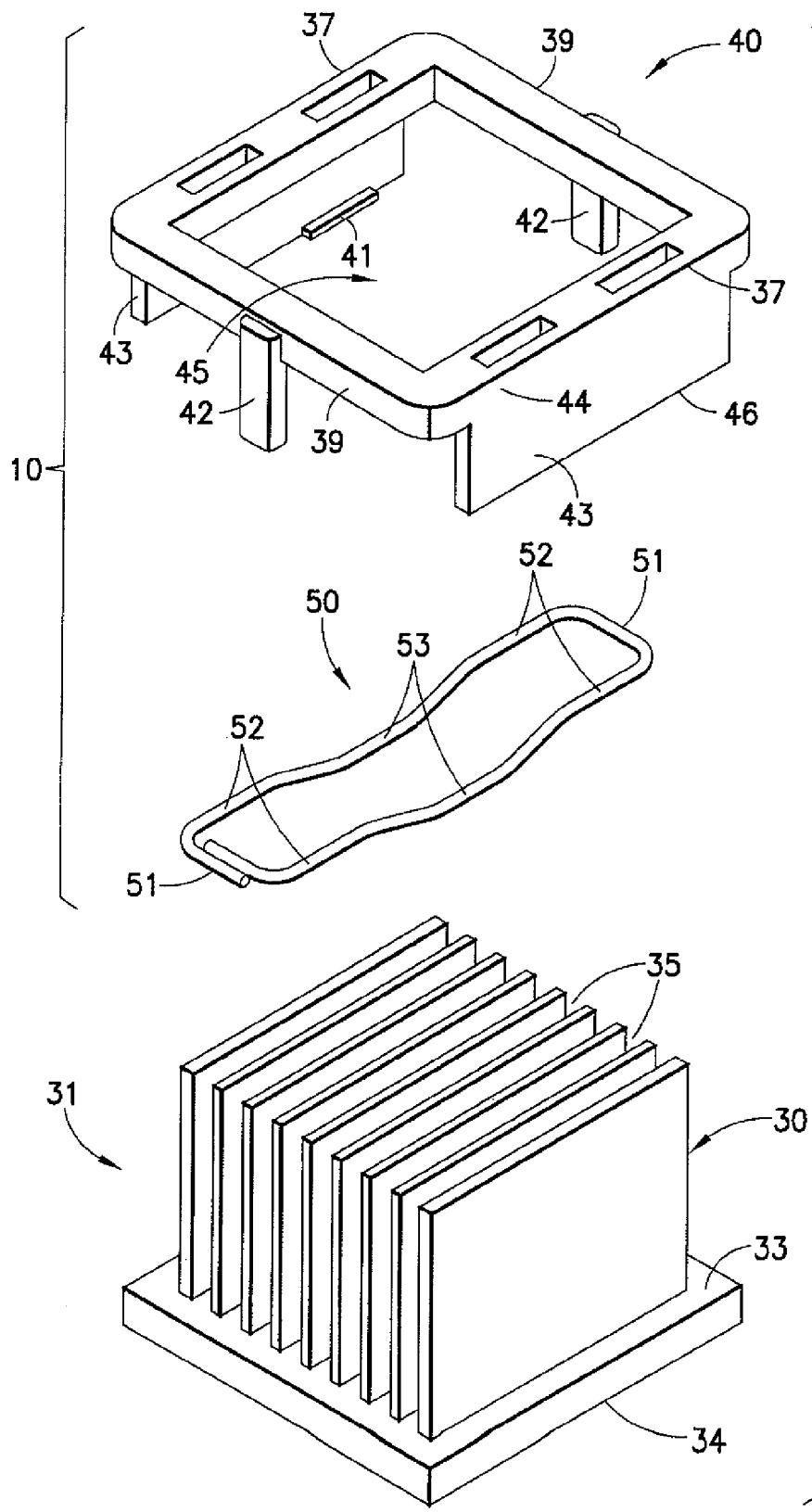
FIG. 1 is an exploded perspective view of an example embodiment of a heat sink mount and assembly in accordance with the present invention.

FIG. 1 is an exploded perspective view of an example embodiment of a heat sink mount 10 for a heat sink 31 in accordance with the present invention. The mount 10 includes a retaining device or clip 40 and a metal spring 50 for mounting heat sink 31 to a heat generating device, heat source, or thermal interface material and, in particular, to a heat generating device, heat source, microprocessor or integrated circuit (IC).

Referring to FIGS. 1-4, 4A, 4B, 5 and 6 the heat sink 31 comprises a base, namely, a contact plate 34 having opposed first and second faces 33, 32 and a plurality of spaced-apart fins 30 separated by gaps 35. The first face 33 of the heat sink 31 is engaged by the metal spring 50 between some of the fins 30 at gaps 35 when the heat sink 31 is coupled to the heat sink mount 10 as explained below. The second face 32 of the heat sink 31 is configured to engage the heat generating device or thermal interface material. The heat sink 31 may comprise aluminum, copper, steel and/or other thermally conductive materials as is well-known in the art and may be manufactured by extrusion, machining, die-casting or forging, or by assembly methods using brazing, soldering or adhesive bonding to join sub-components into an assembly.

The retaining device 40 comprises four side portions surrounding a substantially rectangular opening. The side portions consist of a first pair of sides 37 opposite each other, and a second pair of sides 39 opposite each other. A pair of elongated side primary framing members such as side walls 43 are arranged on sides 37. For example, the side walls 43 may be plates extending along part or all of the length of sides 37 as shown in FIG. 1. Each of the side walls 43 is connected to or integral with its respective side 37 at a first end 44 and has a distal free end 46. One or more engagement members, such as hooks 41, are located at or proximate the distal free end 46.

Each of the remaining sides 39 supports one or more secondary framing members such as one or more columns 42 extending from the sides as shown in FIG. 1. For example, the columns 42 extend from the sides 39 at a length substantially equal to the length of side walls 43. Although a single column 42 on each side 39 is depicted in FIG. 1, it should be appreciated that this is solely a design choice and that multiple columns can be present on each side, such as is shown in the embodiment of FIG. 4B.

The retaining device 40 may comprise an engineering plastic, aluminum or other machinable materials or other material that can be molded or cast. The retaining device 40 may be manufactured by injection molding, machining, die-casting, forging or fast prototyping methods such as stereo lithography or 3D printing.

Figure 2:
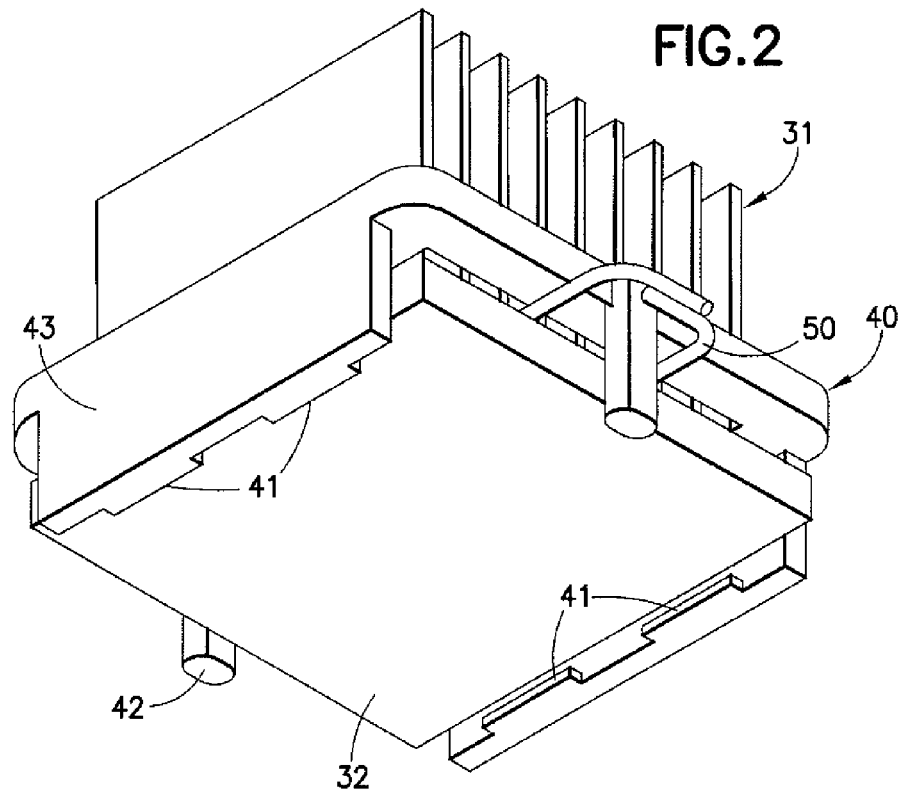
FIG. 2 is a perspective view of the heat sink mount of FIG. 1 in a preferred operating configuration.
Figure 3:
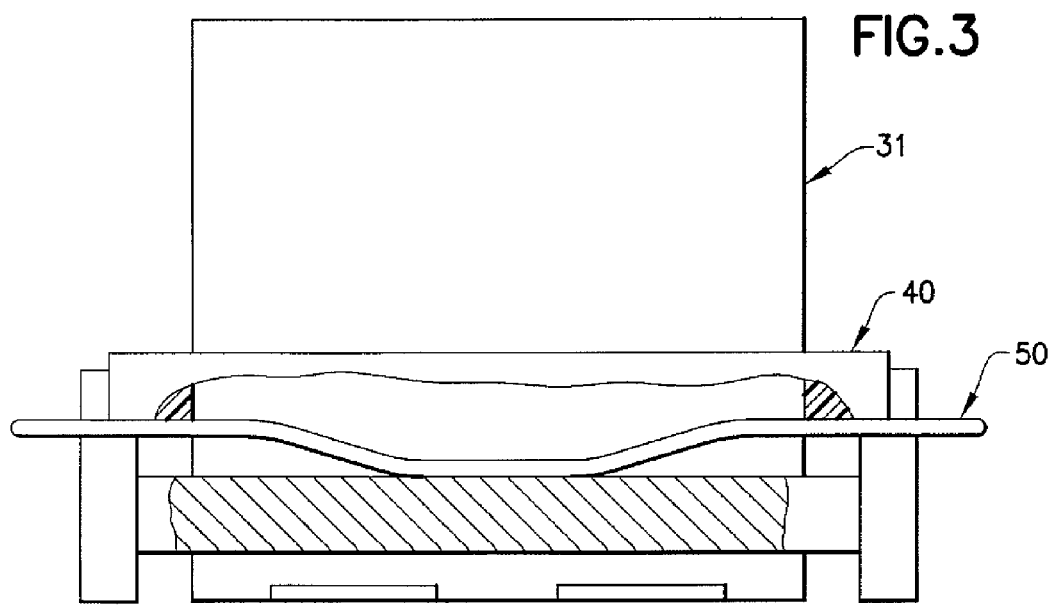
FIG. 3 is a schematic side view of the heat sink mount of FIG. 1 in a preferred operating configuration.

The separation of the opposite columns 42 and opposite side walls 43 defines a receiving space 45 through which the heat sink 31 is received in the retaining device 40 such that the fins 30 are positioned as shown in FIG. 2 and the second face 32 of the contact plate 34 is proximate the hooks 41. The hooks 41 and/or walls 43 and columns 42 are made of resilient material which can be flexed to accommodate insertion of the heat sink 31 into the receiving space 45. As will be appreciated, the additional framing members 42 provide lateral containment of the heat sink within the sides 39.

The contact plate 34 is dimensioned such that edges of the contact plate 34 engage and flex the hooks 41 as the heat sink 31 is inserted into the receiving space 45. The edges of the contact plate 34 can alternatively be tapered and/or the hooks 41 angled to further facilitate insertion of the heat sink 31 into the mount 10. For example, the sides of the contact plate 34 can be tapered and/or the hooks 41 angled with respect to the receiving space 45 to facilitate engagement of the retaining device to the heat sink (FIG. 4C). Alternatively, the distal free ends 46 of the side walls 43 can be separated by bending to provide clearance for the heat sink 31. After the heat sink 31 is fully inserted into the retaining device 40, i.e., when the second face 32 of the contact plate 34 is proximate the hooks 41 and the heat sink 31 is in its intended position in the mount 10, the hooks 41 and/or columns 42 and the side walls 43 will return to their original, unflexed, positions.

Figure 4:
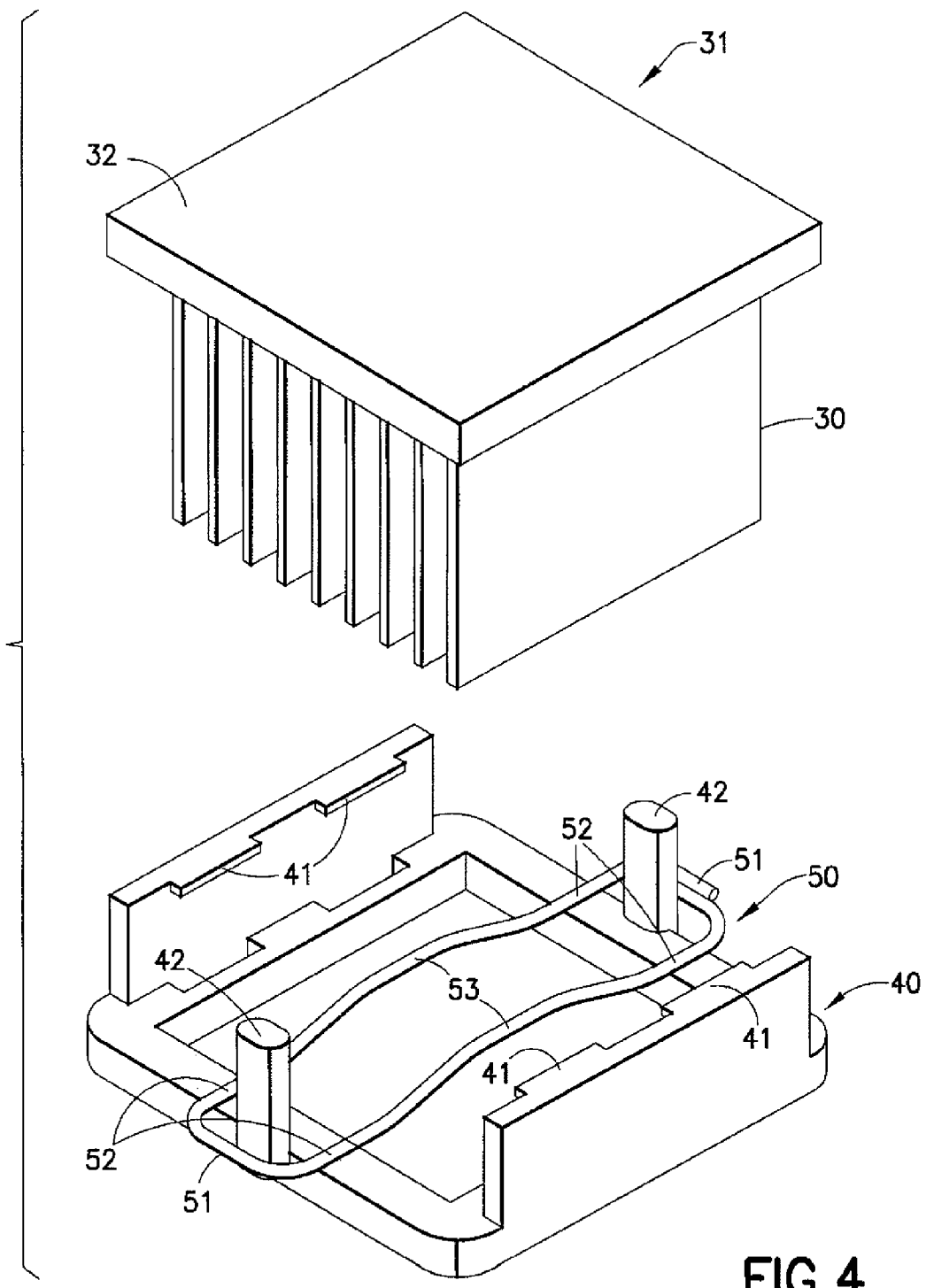
FIG. 4 is another exploded perspective view of the heat sink mount and assembly of FIG. 1.

The metal spring 50 has a closed shape cross-section, e.g., a rectangular loop, etc., having a pair of truncated sides 51 and a pair of elongated sides 52. In one embodiment as shown in FIG. 4, the spring is dimensioned such that the truncated sides 51 seat about the columns 42 and across the first face 33 of the contact plate 34 such that the elongated sides 52 are positioned in the gaps 35 when the heat sink 31 is positioned in the retaining device 40 in its intended manner. Thus, the spring 50 bounds one or more fins 30. The elongated sides 52 of the spring 50 comprise heat sink engagement regions 53 that are offset with respect to the truncated sides 51. The offset regions 53 are preferably disposed between ends of the pair of elongated sides 52. As shown in FIG. 1, the elongated sides 52 are bent between each of the truncated sides 51 to create the offset regions 53. The offset regions 53 apply a force to the first face 33 of the contact plate 34 in a direction toward the hooks 41.

The metal spring 50 may, alternatively, comprise multiple offset regions 53 having the same offset amount such that the metal spring 50 engages the first face 33 of the contact plate 34 in multiple areas at the gaps 35 between the fins 30 of the heat sink 31.

The metal spring 50 may be constructed of a metal wire having a circular cross section or a relatively thin metal strip in a circular or non-circular cross-section. The metal spring 50 may have various different offsets and wire diameters to achieve a desired deformation performance for the spring. The metal spring 50 may comprise steel or brass, or other metal material of sufficient strength and may be manufactured by stamping, forging or molding.

Figure 4A:
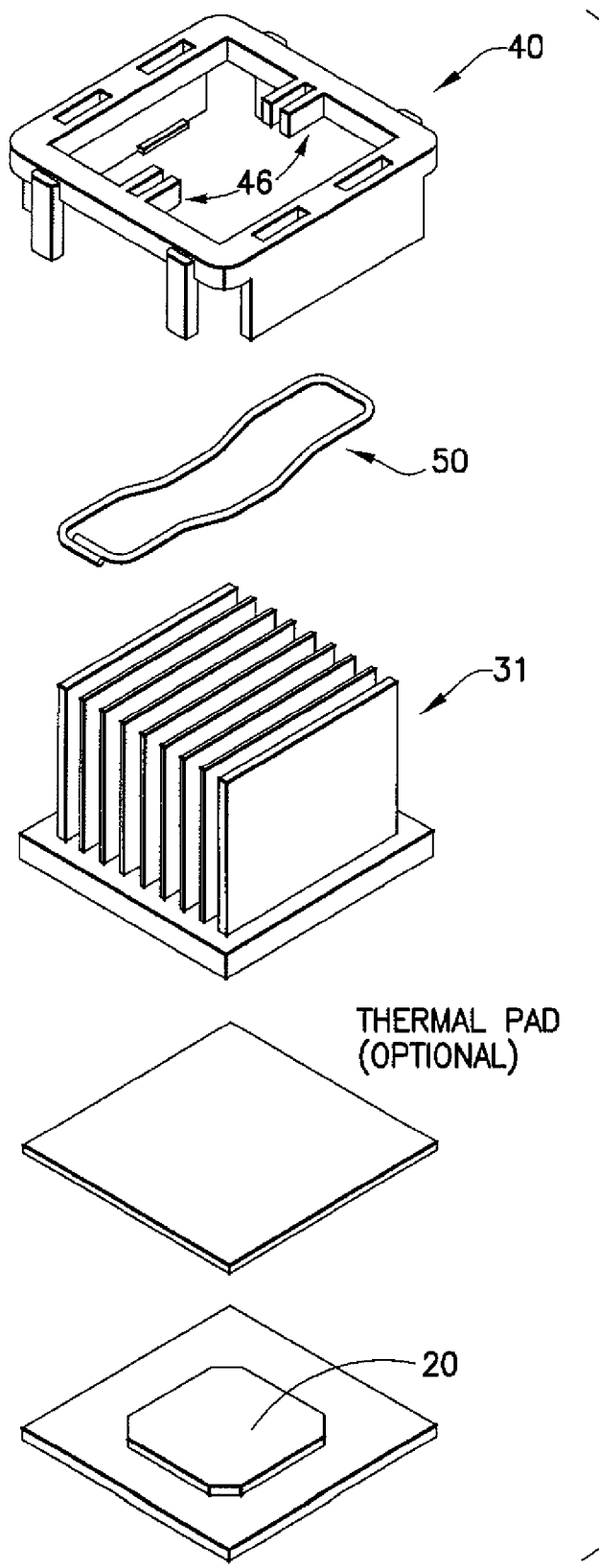
FIG. 4A is an alternative spring location to the spring location of FIG. 4.

In an alternative embodiment, the metal spring 50 may be dimensioned to seat only about one or more fins 30, as shown in FIGS. 4A and 4B, as opposed to seating about the columns 42 as shown in FIG. 4. As shown in FIGS. 4A and 4B, the truncated sides 51 of the metal spring 50 may alternatively engage one or more protrusions 46 that extend from the first or second pair of the opposing sides of the retaining device 40 into the opening. With the heat sink 31 disposed in the retaining device 40 and the metal spring 50 in place, as shown in FIG. 4B, the contact plate 34 is maintained in the receiving space 45 between the hooks 41, walls 43 and columns 42. In this position, the offset regions 53 of the spring press on the first face 33 of the contact plate to urge the contact plate toward the hooks 41.

Figure 4D:
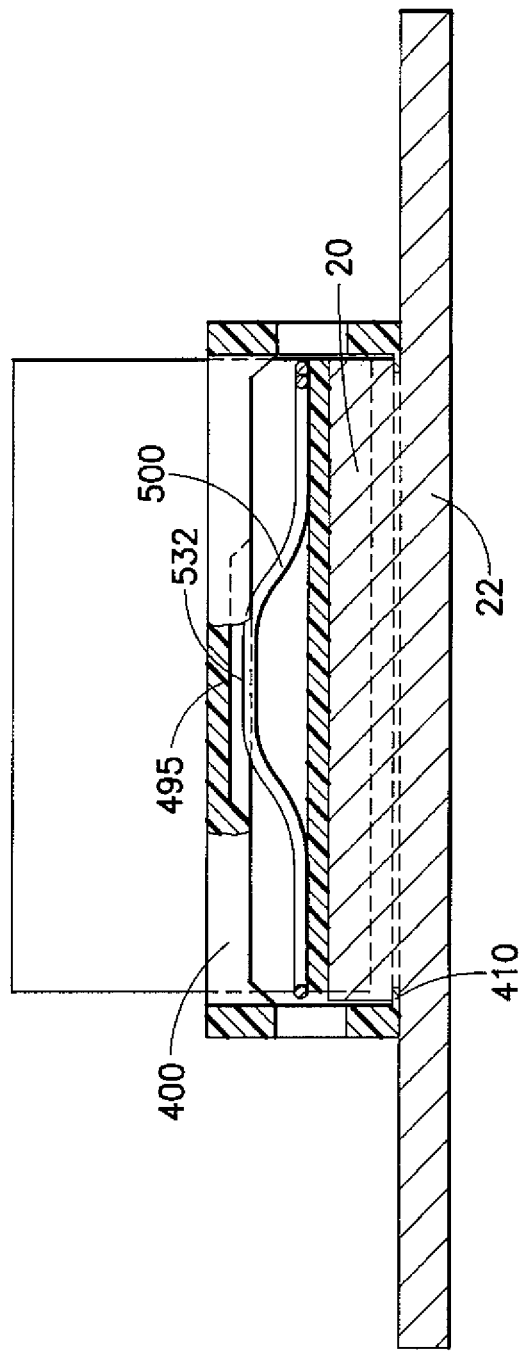
FIG. 4D is a side view of the alternative retaining device and spring configuration of FIG. 4C.

In another alternative embodiment, a metal spring 500 may be dimensioned to have offset regions 532 that engage a retaining device 400 at receiving areas 495 as shown in FIGS. 4C and 4D. The retaining device 400 comprises four side portions surrounding a substantially rectangular opening. The side portions consist of a first pair of sides 370 opposite each other, and a second pair of sides 390 opposite each other. A pair of elongated side framing members such as walls 430 are arranged on sides 370. The walls 430 may include cutouts 435 to allow an increased airflow to a heat sink 310. For example, the side walls 430 may be plates extending along part or all of the length of sides 370 and including air gaps or cutouts 435 as shown in FIG. 4C. Each of the side walls 430 is connected to or integral with its respective side 370 at a first end 440 and has a distal free end 460. One or more engagement members, such as hooks 410, are located at or proximate the distal free end 460. The second pair of opposing side portions 390 comprises channels or slots forming one or more spring receiving areas 495 vertically offset from hooks 410.

The spring receiving areas 495 are configured to receive offset sections 532 between end sections 534 of the pair of elongated sides 520 of the metal spring 500. The pair of elongated sides 520 are received in the slots 495 formed in the retaining device 400. The slots are preferably dimensioned to provide a friction fit with the offset sections 532. The separation of the opposite side walls 430 defines a receiving space 450 through which the heat sink 310 is received in the retaining device 400 such that the fins 300 are positioned as shown in FIG. 4D and a second face 320 of the contact plate 340 is proximate the hooks 410 when the heat sink 310 is in its intended position in the retaining device 400.

With continued reference to FIGS. 4C and 4D, the metal spring 500 has a closed shape cross-section, e.g., a rectangular loop, etc., having a pair of truncated sides 510 and a pair of elongated sides 520. The spring is dimensioned such that ends 534 of the pair of elongated sides 520 and the pair of truncated sides 510 engage a first face 330 of the heat sink 310 when the heat sink 310 is positioned in the retaining device 400 in its intended manner. Thus, the spring 500 bounds only one or more fins 300. The ends 534 of the pair of elongated sides 520 and the pair of truncated sides 510 engage and apply a force to the first face 330 of the contact plate 340 in a direction toward the hooks 410.

The heat sink 310 has a base, namely, a contact plate 340 having opposed first and second faces 330, 320 and a plurality of spaced-apart fins 300 separated by gaps 350. The second face 320 of the heat sink 310 is configured to engage the heat generating device or thermal interface material. The heat sink 310 has a diffusion fin arrangement as shown in FIG. 4C. For example, a first portion of the fins 301 may extend in a perpendicular direction from the first face 330 of the heat sink 310 and pass through the opening of the receiving device 400, and a second portion of the fins 302 may extend at less than perpendicular angles from the first face 330 of the heat sink 310 outside of the opening of the receiving device 400. The metal spring 500 seats only about the first portion of the fins 301. The second portion of the fins 302 can thus exceed a boundary defined by the opening of the retaining device 400 and/or a boundary of the chipset area. A pair of elongated side framing members such as ribs 388 are arranged on a pair of opposing sides of the contact plate 340 of the heat sink 310. For example, the ribs 388 may be plates extending along part or all of the length of the pair of opposing sides of the contact plate 340 as shown in FIG. 4C. Each of the ribs 388 is connected to or integral with its respective side at a first end 392 and has a distal free end 394. One or more engagement members, such as barbs 396, are located at or proximate the distal free end 394.

Figure 5:
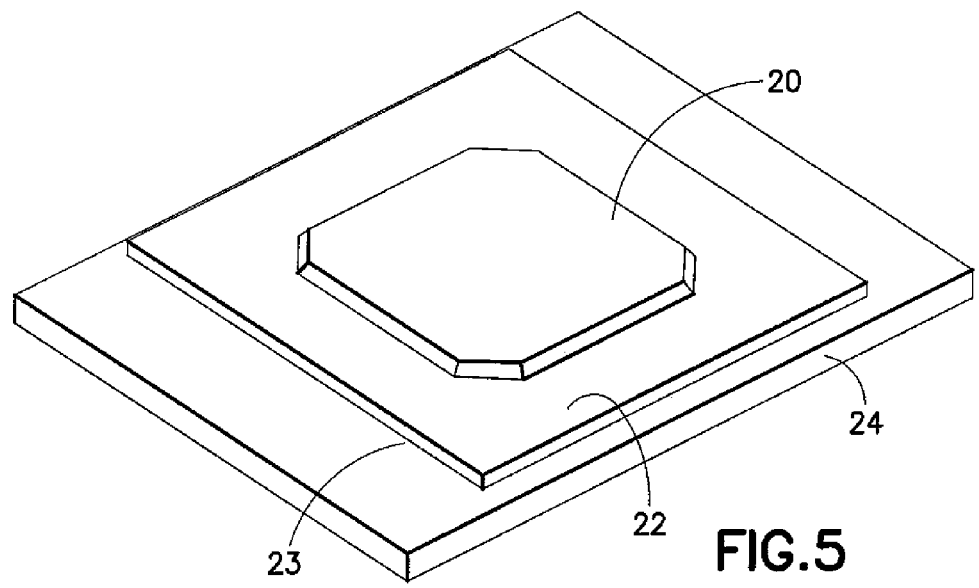
FIG. 5 is a perspective view of a BGA package mounted to a printed circuit board PCB.

The embodiments of the heat sink mounts disclosed herein are particularly well suited for interface with a BGA package mounted to a PCB 24, an example of which is depicted in FIG. 5. The BGA package includes a component, e.g., an integrated circuit or microprocessor 20, etc., positioned on a submount or substrate 22. The reverse side of the substrate 22, i.e. the side opposite the side containing the IC 20, contains an array of solder balls, as is known in the art. The BGA package is attached to the PCB, such as by solder re-flow, which results in the BGA package being vertically offset from the PCB 24 (FIG. 5) by a gap 23. Because of this configuration, the retaining device 40, 400 can be pressed over the IC 20 such that the hooks 41, 410 seat in the gap 23. This motion causes compression of the spring 50, 500 until the IC 20 is positioned between the hooks 41, 410 and lower heat sink surface 32, 320. Once the retaining device is released, the spring will apply a compression force against upper surface 33, 330 to force lower surface 32, 320 into good thermal contact with the IC 20.

The force versus displacement characteristic of the spring can be engineered by well know methods to produce the desired compression force between the metal spring 50 and the hooks 41 concurrent with the desired shape change of the spring. By design, various levels of the compression force can be applied between the heat sink 31 and the hooks 41, thereby allowing the force applied directly to the hooks 41—which are relatively weak due to a limited space—to be reduced or limited. The reliability of the heat sink 31 at impact test, vibration test and loading test may thus be significantly increased. An allowed horizontal motion of the metal spring 50 is restricted as a result of interaction with the columns 42 and/or fins 30.

Figure 6:
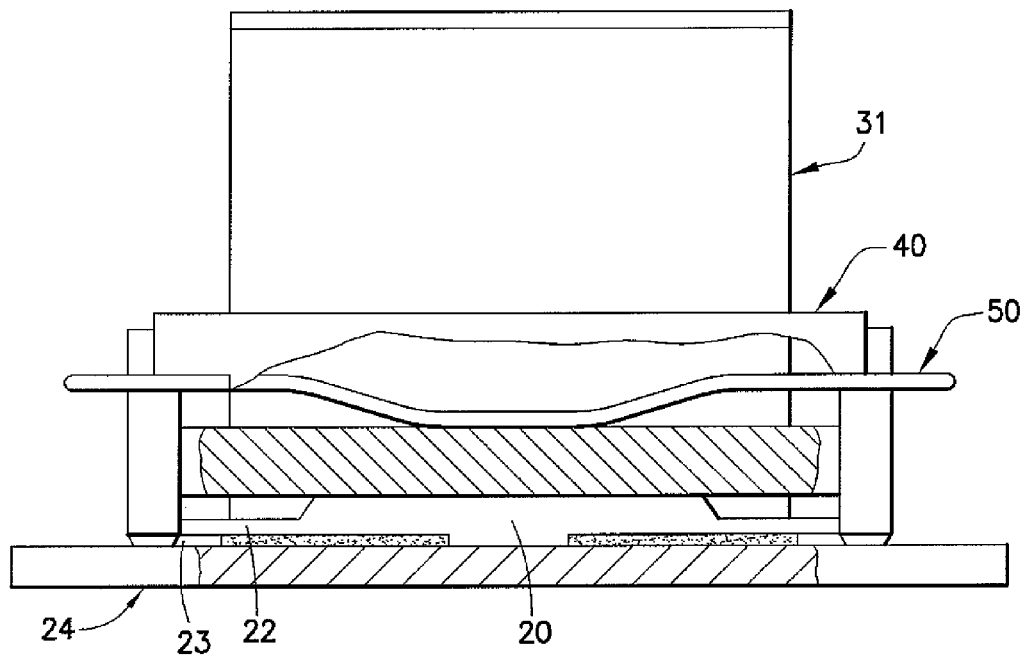
FIG. 6 is a schematic side view of the heat sink mount and assembly of FIG. 1 mounted to the BGA package attached to the PCB of FIG. 5 in accordance with the present invention.
Figure 10:
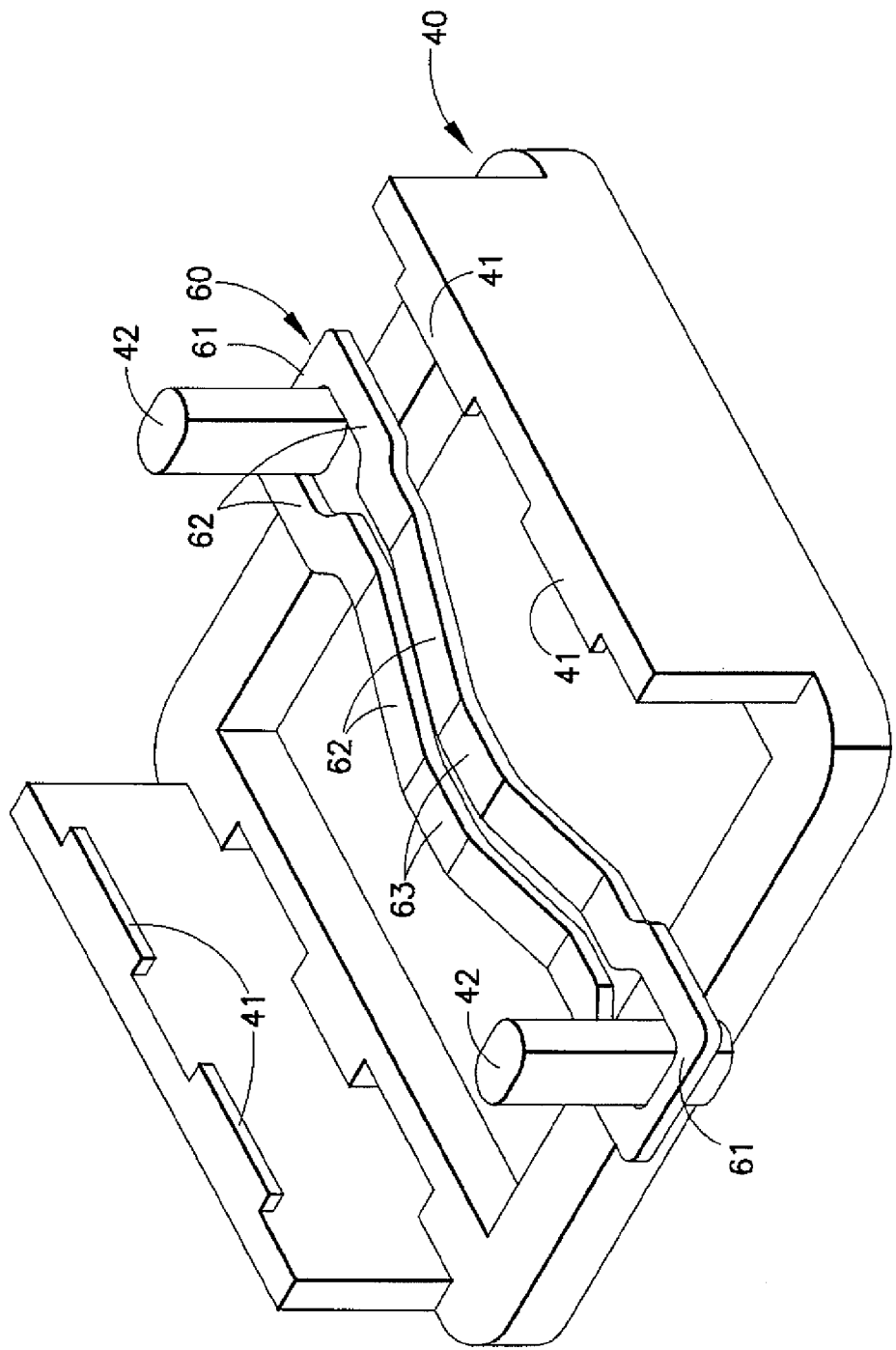
FIG. 10 is a perspective view of the heat sink mount of FIG. 7 with the heat sink removed.
Figure 11:
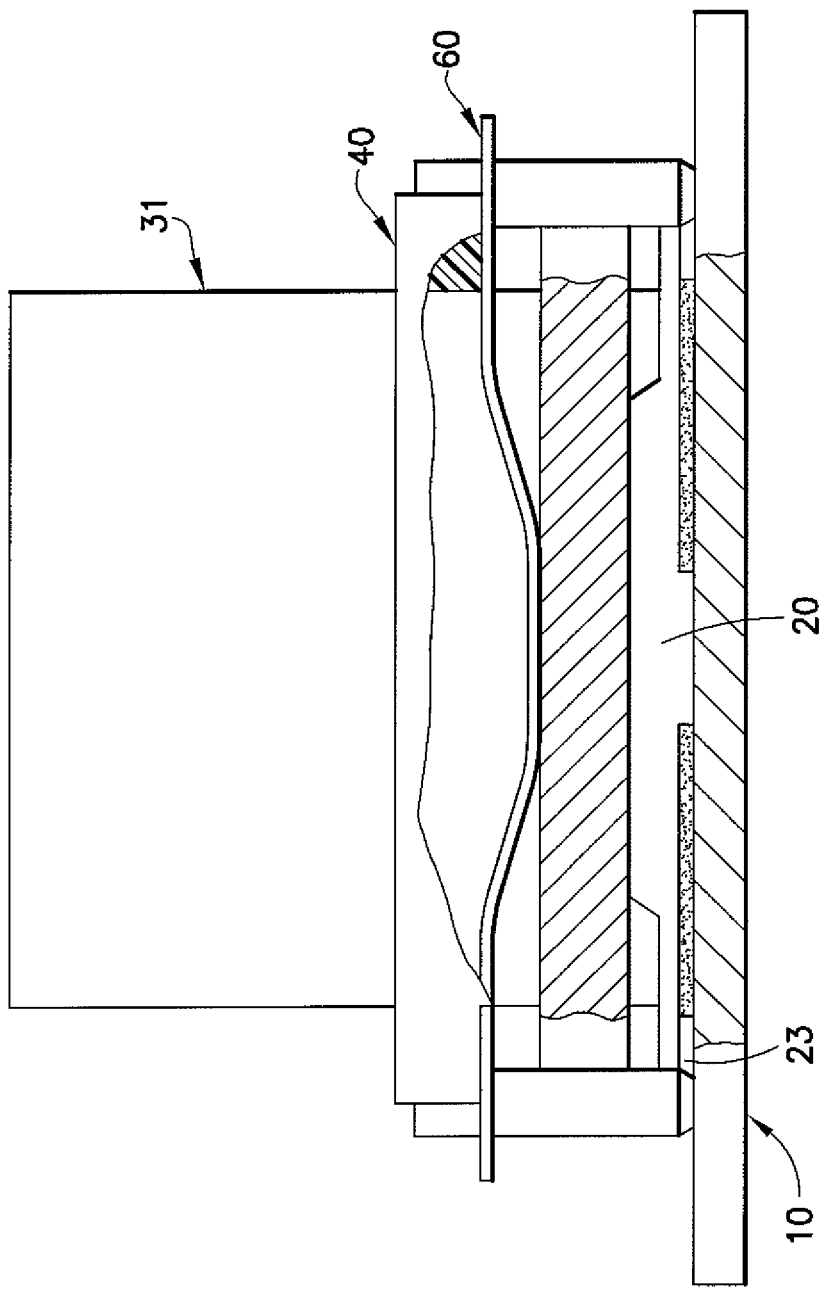
FIG. 11 is a schematic side view of the heat sink mount and assembly of FIG. 7 mounted to the BGA package attached to the PCB of FIG. 5 in accordance with the present invention.

The receiving space 45 is configured to confine movement of the heat sink 31 between the pairs of opposing sides 37 and 39 when the heat sink 31 is in its intended position in the mount 10. The side walls 43 are configured to confine the motion of the heat sink 31 in a direction between the first pair of opposing sides 37. The columns 42 are configured to confine the motion of the heat sink 31 between the second pair of opposing sides 39. In an alternative embodiment, such as that shown in FIGS. 4C and 4D, the ribs 388 confine the motion of the heat sink 31 between the second pair of sides 390 that are opposite each other. The retaining device 40 and metal spring 50 provide the compression force between the heat sink 31 and the hooks 41, thereby urging the heat sink 31 into good thermal contact with the IC 20. When the heat sink 31 is in its intended position in the mount 10 and the mount 10 is mounted to the BGA package, the hooks 41 are seated in the gap 23, as shown in FIG. 6.

Depending on the requirements of the user, the metal spring 50 and retaining device 40 may be assembled together at a first location and then that sub-assembly shipped to another site where the heat sink 31 is incorporated, and then the full assembly (retaining device 40, spring 50 and heat sink 31) attached to the BGA package IC 20 which is mounted to the PCB 24. Alternatively, the full assembly (retaining device 40, spring 50 and heat sink 31) can be assembled and then provided to another site for attachment to the PCB-mounted BGA package.

FIGS. 7-11 show a heat sink mount including a metal plate spring 60 according to another example embodiment. The metal plate spring 60 may be a substantially flat sheet of metal in a circular or non-circular cross-section, e.g., a rectangular loop having truncated sides 61. The truncated sides 61 seat about the columns 42 of the retaining device 40 and across the first face 33 of the heat sink contact plate 34 when the heat sink 31 is positioned in the receiving device 40 in its intended manner. Elongated sides 62 of the plate spring 60 comprise offset regions 63 that are offset with respect to the retaining device truncated sides 61. The metal plate spring 60 may have various offsets and plate dimensions to achieve a desired or, alternatively, a predetermined displacement characteristic. The metal plate spring 60 is coupled to the retaining device 40 such that the offset regions 63 engage the heat sink 31 when the heat sink 31 is inserted into the retaining device 40. The remaining structure and operation of the heat sink assembly according to example embodiments shown in FIGS. 7-11 are the same as example embodiments shown in FIGS. 1-6 and a detailed description thereof is therefore omitted in the interest of brevity.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A heat sink mount, comprising:
a retaining device comprising a first pair of opposing sides and a second pair of opposing sides, the first and second pairs of opposing sides surrounding an opening defined by inner surfaces of the first and second pairs of opposing sides, the first pair of opposing sides having primary framing members, at least some of the primary framing members having a first end at a respective side and a distal free end, with at least one engagement member positioned proximate the distal free ends, the primary framing members and the opening defining a receiving space for a heat sink having fins and a contact plate, the second pair of opposing sides each having at least two protrusions extending inwardly from a respective inner surface into the opening, each of the protrusions extending partially across the opening and having a distal end;
a metal spring configured in a closed shape cross-section and for interfacing with the retaining device, the metal spring defining a loop comprising a pair of elongated sides, a pair of truncated sides and heat sink engagement regions, the heat sink engagement regions being positioned against the contact plate when the metal spring is interfaced with the retaining device, for urging the contact plate towards the engagement members when the heat sink is contained in the receiving space,
wherein the metal spring is arranged to bound one or more fins such that the one or more fins are positioned inside of the loop and the protrusions are each arranged to respectively extend into a gap between fins of the heat sink to position the distal end between the fins and directly engage with a truncated side of the metal spring as the metal spring is interfaced with the retaining device for urging the contact plate toward the engagement members.

2. The heat sink mount of claim 1, wherein the second pair of opposing sides has one or more secondary framing members, the primary and secondary framing members defining the receiving space for the heat sink.

3. The heat sink mount of claim 2, wherein each of the pair of truncated sides is respectively interfaced with the retaining device at two protrusions.

4. The heat sink mount of claim 3, wherein the heat sink engagement regions comprise a portion of the elongated sides.

5. The heat sink mount of claim 1, wherein the metal spring is formed of a metal wire having a substantially circular cross section.

6. The heat sink mount of claim 1, wherein the engagement members comprise a resilient material.

7. The heat sink mount of claim 1, wherein the primary and secondary framing members comprise a resilient material.

8. The heat sink mount of claim 1, wherein the engagement members are angled in a direction toward the receiving space.

9. The heat sink mount of claim 1, wherein the at least one engagement member is configured for releasable attachment within a gap formed between a ball grid array package and a printed circuit board when the ball grid array package is connected to the printed circuit board.

10. A heat sink assembly, comprising:
a heat sink comprising a contact plate having opposing first and second faces, a plurality of fins extending from the first face of the contact plate, and a plurality of gaps between the fins;
a retaining device comprising a first pair of opposing sides and a second pair of opposing sides, the first and second pairs of opposing sides surrounding an opening defined by inner surfaces of the first and second pairs of opposing sides, the first pair of opposing sides having primary framing members, at least some of the primary framing members having a first end at a respective side and a distal free end, with at least one engagement member positioned proximate the distal free ends, the primary framing members and the opening defining a receiving space for the heat sink, the second pair of opposing sides each having at least two protrusions extending inwardly from a respective inner surface into the opening, each of the protrusions extending partially across the opening and having a distal end; and
a metal spring configured in a closed shape cross-section and for engagement with the retaining device, the metal spring defining a loop comprising a pair of elongated sides, a pair of truncated sides and heat sink engagement regions, the heat sink engagement regions being positioned against the contact plate when the metal spring is engaged with the retaining device, to urge the contact plate towards the engagement members,
wherein the metal spring is arranged to bound one or more fins such that the one or more fins are positioned inside of the loop and the protrusions are each arranged to respectively extend into a gap between fins of the heat sink to position the distal end between the fins and directly engage with a truncated side of the metal spring as the metal spring is interfaced with the retaining device for urging the contact plate toward engagement members.

11. The heat sink assembly of claim 10, wherein the second pair of opposing sides has one or more secondary framing members, the primary and secondary framing members defining the receiving space for the heat sink.

12. The heat sink assembly of claim 11, wherein each of the truncated sides is respectively engaged with the retaining device at two protrusions.

13. The heat sink assembly of claim 12, wherein the heat sink engagement regions comprise a portion of the elongated sides.

14. The heat sink assembly of claim 10, wherein the metal spring is formed of a metal wire having a substantially circular cross section.

15. The heat sink assembly of claim 10, wherein the engagement members comprise a resilient material.

16. The heat sink assembly of claim 10, wherein the primary and secondary framing members comprise a resilient material.

17. The heat sink assembly of claim 10, wherein the engagement members are angled in a direction toward the receiving space.

18. The heat sink assembly of claim 10, wherein the at least one engagement member is configured for releasable attachment within a gap formed between a ball grid array package and a printed circuit board when the ball grid array package is connected to the printed circuit board.

19. A heat sink mount, comprising:
a retaining device comprising a first pair of opposing sides and a second pair of opposing sides, the first and second pairs of opposing sides surrounding an opening defined by inner surfaces of the first and second pairs of opposing sides, the first pair of opposing sides having primary framing members, at least some of the primary framing members having a first end at a respective side and a distal free end, with at least one engagement member positioned proximate the distal free ends, the primary framing members and the opening defining a receiving space for a heat sink having fins and a contact plate, the second pair of opposing sides each having one or more protrusions extending inwardly from a respective inner surface into the opening, each of the protrusions extending partially across the opening and having a distal end;

a metal spring configured in a closed shape cross-section and for interfacing with the retaining device, the metal spring defining a loop comprising a pair of elongated sides, a pair of truncated sides and heat sink engagement regions, the heat sink engagement regions being positioned against the contact plate when the metal spring is interfaced with the retaining device, for urging the contact plate towards the engagement members when the heat sink is contained in the receiving space, wherein the metal spring is arranged to bound one or more fins such that the one or more fins are positioned inside of the loop and the protrusions are each arranged to respectively extend into a gap between fins of the heat sink to position the distal end between the fins and directly engage with a truncated side of the metal spring as the metal spring is interfaced with the retaining device for urging the contact plate toward the engagement members.

* * * * *